METHOD OF MAKING CONDUCTIVE CIRCUIT PATTERNS
BY INTAGLIO PROCESS
Filed Jan. 16, 1967
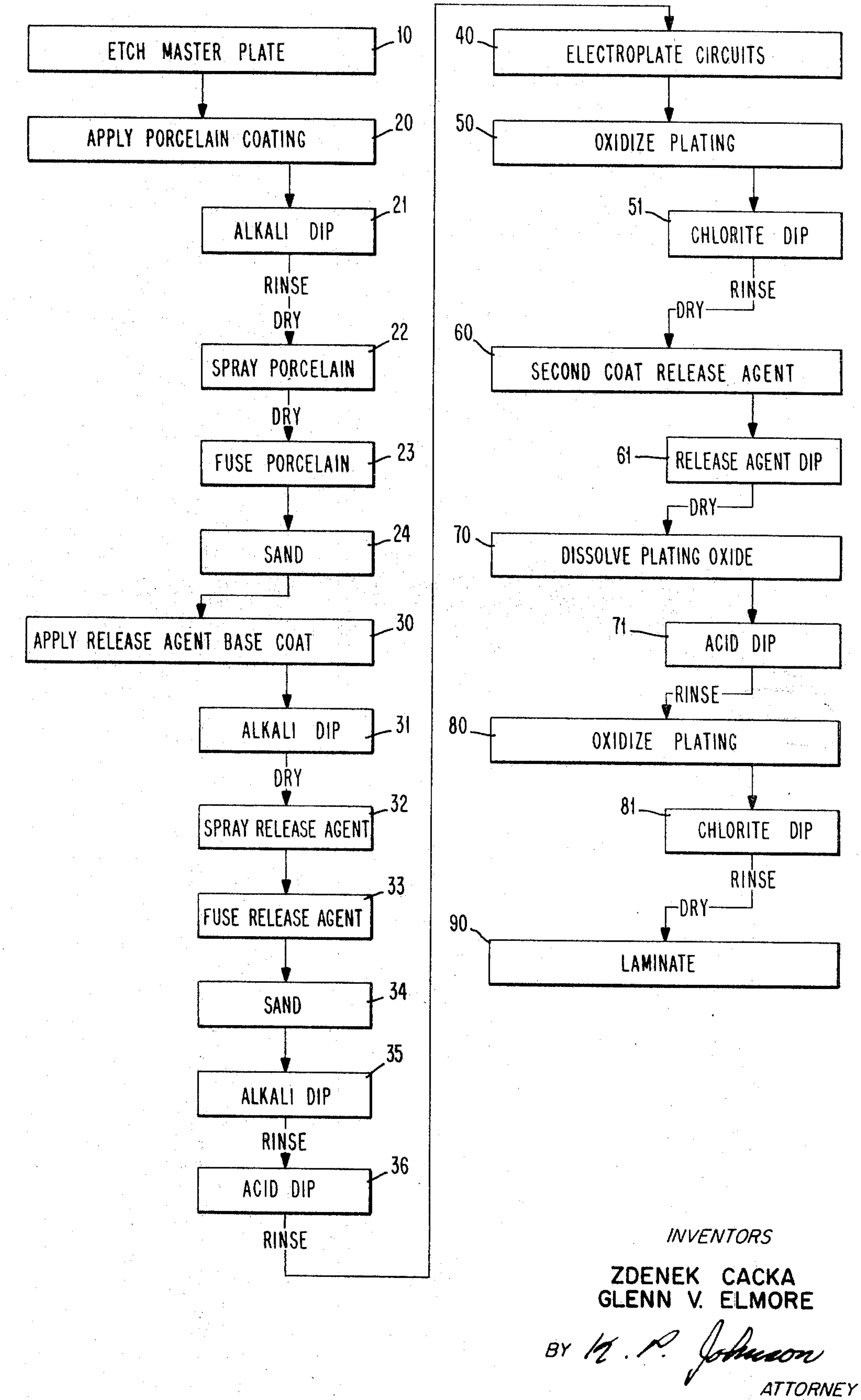
*INVENTORS*
ZDENEK CACKA
GLENN V. ELMORE
*BY* K. P. Johnson
*ATTORNEY*

United States Patent Office 3,518,130
Patented June 30, 1970

3,518,130

METHOD OF MAKING CONDUCTIVE CIRCUIT PATTERNS BY INTAGLIO PROCESS

Zdenek Cacka, Forest Hills, and Glenn V. Elmore, Vestal, N.Y., assignors, by direct and mesne assignments, to International Business Machines Corporation, Armonk, N.Y., a corporation of New York Filed Jan. 16, 1967, Ser. No. 609,350
Int. Cl. C23f *1/02;* B44c *1/24*
U.S. Cl. 156—3 6 Claims

ABSTRACT OF THE DISCLOSURE

Method of producing printed circuits by the intaglio plate-lamination process wherein the release agent is applied to the entire working surface of the intaglio plate after forming the circuits but removed from only the circuits prior to lamination.

FIELD OF THE INVENTION

One of the methods of manufacturing so-called "printed circuits" is that of using the intaglio process wherein a master plate is first produced having positive or raised areas on which the conductive circuit lines are deposited and having etched or negative, recessed areas defining the boundaries of the conductive areas. After the master plate has been prepared with the desired circuit pattern, the etched areas are treated with a non-conductive release agent and the circuit metal, usually copper, is plated onto the positive areas. The master plate is laminated subsequent to plating with a dielectric substrate having an adhesive thereon. The plated circuit metal adheres to the adhesive and the master plate is then parted from the substrate leaving the circuit on the substrate. The master plate can now be reused to generate another identical circuit pattern for transfer.

DESCRIPTION OF THE PRIOR ART

Difficulty has been experienced heretofore in maintaining a practical useful life for the release agent in the negative areas. The usual experience is that some release agent is lost with each plating and laminating step so that the circuit definition deteriorates. The plated metal encroaches upon the negative areas at their edges and is not readily released upon laminatiton so that the release agent is torn and loosened at the interface with the master plate. A further difficulty is that the release agent must initially be built up to considerable thickness to serve as a non-conductor to prevent the circuit metal from plating thereover, the usual method for plating being electroplating. The replacement of the release agent again necessitates a series of coatings to build up the required thickness.

Accordingly, it is a primary object of this invention to provide a metal of improving and maintaining the quality of the release agent and circuit definition for the manufacture of printed circuits by the intaglio plate process.

A further object of this invention is to provide a method of regularly renewing the release agent on an intaglio plate as used for producing printed electrical circuits whereby the removal of the circuits is facilitated and the circuit definition is improved.

A still further object of this invention is to provide a method of coating the intaglio plate with the release agent subsequent to each plating operatiton but prior to laminating and thereafter removing the release agent from only the plated circuit areas on the master plate.

SUMMARY OF THE INVENTION

In the attainment of the foregoing objects of the inventiton, an intaglio master plate, which has been etched in the usual manner, is coated first with porcelain and then a release agent in only the etched or negative areas. The master plate is thereafter suitably cleaned and the circuit metal is electroplated on the positive uncoated areas to the desired thickness. However, before the plated circuit is removed, it is subjected to an oxidizing bath, and a thin porous coat of release agent is applied over the entire front surface of the master plate. The coated master plate is then subjected to an acid bath which dissolves the oxidized layer of the circuit metal beneath the release agent and removes the release agent from only the circuit areas. The cleaned circuit metal is then subjected to a second oxidizing bath which does not attack the release agent or porcelain, and then dried for lamination. The second oxidizing treatment improves the adhesion of copper to an adhesive. At this point a dielectric substrate with adhesive coated over the entire surface is laminated with the master plate under heat and pressure and then parted therefrom so that the plated circuit metal is transferred to the substate. After cleaning, the plate may again be used for electroplating another circuit thereon and the process repeated, as just described.

It will be seen from the foregoing process that a thin coat of release agent is applied to the porcelain with each use of the master plate before lamination so that the release agent is in effect renewed with each plating operation. This method prevents the breakdown of the original release coating and preserves the bond at the interface between the original release coating and the master plate.

The foregoing and other objects, features, and advantages of the invention will be apparent from the following more particular description of the preferred method of the invention as illustrated in accompanying drawing.

DESCRIPTION OF THE PREFERRED EMBODIMENT

In practicing the method of the invention, the intaglio master plate is produced in the conventional manner with the desired circuit pattern thereon. This is accomplished by coating a polished 300 series, stainless steel plate with a photographic resist material which is then exposed as a positive of the desired circuit pattern. After the exposure step, the unexposed resist material is washed off and an etchant such as ferric chloride is applied which attacks the stainless steel in those areas not covered by the exposed photosensitive resist. Etching is permitted to continue until a desired depth has been achieved in the master plate, approximately .005 of an inch. Etching is terminated by removing the plate from the ferric chloride and rinsing. The photo-resist is removed by well known cleaning procedures. The etched plate is baked at approximately 800° F. for about one half hour to remove all organic residue, and then dipped briefly in a solution of 30% hydrochloric acid to remove all metal oxides. The plate is then rinsed and dried. Master plate etching is indicated as 10 in the drawing.

The master plate at this point has been prepared with the desired circuit pattern represented by producing positive or raised areas which can be electroplated. However, the etched or recessed areas are first coated with a nonconductive material 20 to prevent the plating of circuit metal therein. Although other materials can be used, porcelain is preferred because of its imperviousness and bonding characteristics.

The porcelain is applied to the master plate by the following steps: The plate is dipped momentarily in a hot alkali bath 21 and then rinsed and dried. The bath may be, for example, a solution of water and "K–2," a product of the Pennsalt Chemical Corporation, Philadelphia, Pa. A typical bath is a solution of eight ounces of K–2 per gallon of water and heated to 150°–180° F. After drying the plate from the alkali bath, porcelain slip is then sprayed at 22 over the entire front surface of the plate, dried, and then heated for a sufficient time and temperature at 23 to fuse the porcelain, as determined by the porcelain characteristics. The porcelain slip used should be matched to the 300 series stainless steel. For example, porcelain slip #2251, manufactured by the O. Hommel Company, Pittsburgh, Pa., may be used. After the porcelain has been fused, it must be removed from the positive areas of the master plate. Such removal 24 is done preferably by a belt sander in a wet sanding process in order to prevent fusion of the removed porcelain particles and to prevent cracks in the remaining negative areas. The master plate should be held flat and rigid to produce uniform removal of the porcelain from the positive areas. The porcelain surface is relatively rough, having pockmarks resulting from bubbles formed during drying.

Upon completion of the sanding process, the base coat of release agent is applied at 30. However, for best adhesion of the release agent to the porcelainized negative areas, the master plate is dipped for approximately one half hour in a hot alkali bath 31, as used above, to provide a slight additional roughness on the porcelain surface. This promotes adhesion of the release agent which is next sprayed on the dried master plate at 32 after the alkali bath. The release agent employed may be any of several fluorocarbons which are adhesive-repellent. The preferred release agent is available under the name "Vydax," a trade nume of the E. I. du Pont de Nemours Company, Inc., Wilmington, Del. The base coat of Vydax is a twenty percent suspension of fluorocarbon in a carrier of Freon, also a product of the aforesaid Du Pont Company. After the Vydax has been sprayed on both the positive and negative areas of the master plate, the plate is placed in an oven for drying and fusing 33 of the fluorocarbon which remains after the Freon is driven off. The fusing process takes place at approximately 600° F. for a period of ten minutes. Following this operation the fused fluorocarbon is sanded off the raised positive plate areas at 34 so that the edged areas now have coated thereon a layer of porcelain covered with a layer of fluorocarbon. Following the sanding step the master plate is again dipped in a hot alkali bath 35, as described above, for approximately one minute and then removed and rinsed in water. The plate is dipped thereafter in a bath 36 of concentrated nitric acid at room temperature for one minute and removed and rinsed again in water. The latter two baths are used to insure that the plate is cleaned and passivated for the succeeding step of electroplating.

The master plate is placed in any of the well-known electroplating baths 40 and the circuit metal, usually copper, is plated to the desired thickness. Alternately, the plate may be given a flash of electroless copper followed by build-up with electrolytic copper. The intaglio process described up to this point is generally well-known. Normally, the completed circuits would now be laminated with a circuit substrate having an adhesive coating thereon, such as epoxy resin, so that the plated circuit metal is transferred to the substrate when the master plate is parted from the substrate at the conclusion of laminating. However, upon parting, the circuit metal adjacent to the fluorocarbon and stainless steel interface tends to tear or remove minute portions of the fluorocarbon coating so that, after the master plate has been used for several times, the definition of the printed circuits becomes poor and the copper does not readily remove at the edges of the porcelain areas. This invention overcomes these deficiencies by renewing the fluorocarbon release agent at 60 simply and efficiently subsequent to each plating operation but prior to laminating.

In accordance with the process of the invention, the master plate, with copper circuits plated thereon, is placed in a hot chlorite solution 51 for two to three minutes at 200° to 215° F. The plate is then removed and rinsed in cold water and dried by heating. The chlorite solution is composed of sodium chlorite, 3.0 p.b.w.; trisodium phosphate, 1.0 p.b.w.; sodium hydroxide, 0.5 p.b.w. and water (deionized) 100.0 p.b.w. All proportions are in parts by weight. The chlorite treatment oxidizes the surface of the copper plating. The master plate is then dipped in a solution 61 of release agent which again is Vydax but comprises a two to ten percent suspension of fluorocarbon in Freon. The Vydax-coated plate is then dried and dipped in any acid 71 which will dissolve cupric oxide. A preferred bath is a solution of hydrochloric acid containing ten to fifteen percent HCl at approximately room temperature. The plate is submerged for a sufficient time to remove the fluorocarbon from the copper which usually takes from one to three minutes and then the plate is rinsed in cold water. The hydrochloric acid permeates the porous fluorocarbon coating and dissolves the cupric oxide beneath the fluorocarbon on the circuit metals so that the fluorocarbon on the plate positive areas floats free from the master plate. The porcelain in the negative areas, however, is not attacked by the acid so that the fluorocarbon remains intact where required.

Although the master plate can now be laminated, it has been found that the plated copper circuit lines have improved adherence to the adhesive on the dielectric substrate upon lamination when there is a slight coating of cupric oxide at 80 adjacent to the adhesive. Accordingly, the master plate is again processed in the hot chlorite solution 81, described above, to produce the oxidation required for maximmum adhesion to the substrate. Upon removing the master plate from the chlorite bath, the plate is rinsed in water and dried. The plate is now ready for lamination 90 with the adhesive coated substrate. An example of such a substrate is a partially cured laminate of glass cloth and epoxy resin which is then laminated with the plated circuits on the intaglio plate under suitable heat and pressure.

Although it has been stated above that the thin film of release agent is added after each plating operation, the application may be made more infrequently such as once for each third or fourth plating operation. However, in an automated process, the control process is simplified if coating is done each cycle. The frequency of coating depends in large part on the laminating temperature and pressure, and experience will determine the optimum application frequency.

While the invention has been described with reference to a preferred embodiment thereof, it will be understood by those skilled in the art that various changes in form and details may be made therein without departing from the spirit and scope of the invention.

What is claimed is:

1. In the intaglio method of producing a conductive circuit pattern of predetermined configuration for transfer to an adhesive, insulative base by selectively etching the surface of a conductive master plate to leave unetched areas in the configuration of said circuit pattern, depositing a layer of ceramic material on said etched areas, coating said ceramic with an adhesive-repellent, and depositing conductive circuit metal on said unetched areas, the improvement comprising the steps of: oxidizing the surface of said circuit metal to form an oxidation layer thereon, coating said oxidation layer and said existing adhesive-repellent with a second layer of adhesive-repellent, and removing said oxidation layer and said adhesive-repellent thereon prior to transferring said circuit metal to said base.

2. The method as described in claim 1 wherein said second layer of adhesive-repellent comprises a porous fluorocarbon.

3. The method as described in claim 1 wherein said circuit metal is copper and said oxidizing step comprises immersing said plate with said copper thereon in a chlorite bath.

4. The method as described in claim 1 wherein said circuit metal is copper and said oxidizing step comprises immersing said plate with said copper thereon in a bath including sodium chlorite, trisodium phosphate, sodium hydroxide and water.

5. The method according to claim 1 further comprising the step of oxidizing said circuit metal to form a second oxidation layer thereon after removing said oxidation layer and said adhesive-repellent and before transferring said circuit metal to said base.

6. The method as described in claim 2 wherein said second fluorocarbon coating is removed by placing said master plate in an acid bath which dissolves only said oxidation layer on said circuit metal thereby releasing any fluorocarbon coating on said circuit metal.

References Cited

UNITED STATES PATENTS

| | | | |
|---|---|---|---|
| 2,447,541 | 8/1948 | Sabee et al. | |
| 2,997,521 | 8/1961 | Dahlgren | 174—68.5 |
| 2,166,366 | 7/1939 | Norris | 204—11 |

JACOB H. STEINBERG, Primary Examiner

U.S. Cl. X.R.

156—233; 161—Printed Circuits; 204—11